US006100786A

United States Patent [19]

Ryu

[11] Patent Number: 6,100,786

[45] Date of Patent: Aug. 8, 2000

[54] FOCUS UNIT OF FLY BACK TRANSFORMER

[75] Inventor: Jae Mun Ryu, Kyungki-do, Rep. of Korea

[73] Assignee: Samsung Electro-Mechanics Co., Ltd., Kyungki-Do, Rep. of Korea

[21] Appl. No.: 09/276,897

[22] Filed: Mar. 25, 1999

[51] Int. Cl.$^{7}$ .................................................... H01L 10/16

[52] U.S. Cl. .......................... 338/128; 338/162; 338/163; 338/167

[58] Field of Search .................................... 338/118, 160, 338/162, 167, 168, 170, 174, 175, 202, 163, 128, 129, 130, 131

[56] References Cited

U.S. PATENT DOCUMENTS

| | | | |
|---|---|---|---|
| 5,889,461 | 3/1999 | Ebata | 338/160 |
| 5,929,745 | 7/1999 | Tsunezawa et al. | 338/160 |

FOREIGN PATENT DOCUMENTS

| | | | |
|---|---|---|---|
| 2216448 | 10/1973 | Germany | 338/130 |
| 98-065047 | 10/1988 | Rep. of Korea . | |
| 854129 | 11/1960 | United Kingdom | 338/131 |

OTHER PUBLICATIONS

Huh (Kor 1998065047) translation.

*Primary Examiner*—Karl Easthom

*Attorney, Agent, or Firm*—Renner, Otto, Boisselle & Sklar, LLP

[57] ABSTRACT

A focus unit of an FBT (fly back transformer) is described, which is installed on a side of the FBT, for adjusting the focus and screen voltages of a cathode ray tube. Focus and screen voltage adjusting round resistor patterns 130 are respectively formed on volume boards 120 of the focus unit, and a supporting shaft 160 is received into a central through hole 140 of the round resistor pattern 120. A connecting pin 170 is inserted into the supporting shaft 160, and a cable 210 is inserted into each of holes of a volume case so as for the cable to be connected to the lower end of the connecting pin 170. A pair of actuation knobs are inserted into a cover, and a slider spring is installed within each of volume bars, while the lower end of the slider spring 230 is movably connected to the round resistor pattern 130. Thus the slider spring for adjusting the focus volume can be easily installed on a volume bar, and the focus and screen voltages can be controlled in a sure manner.

9 Claims, 5 Drawing Sheets

FOCUS UNIT OF FLY BACK TRANSFORMER

BACKGROUND OF THE INVENTION

1. Field of the Invention

The present invention relates to a fly back transformer (to be called "FBT" below) which generates a high voltage to be supplied to a cathode ray tube of a TV or a monitor. Particularly, the present invention relates to a focus unit of an FBT, which is installed on a side of the FBT, for adjusting the focus and screen voltages of a cathode ray tube. More specifically, the present invention relates to a focus unit of an FBT, in which a slider spring for adjusting the focus volume can be easily installed on a volume bar, and the focus and screen voltages can be controlled in a sure manner. That is, focus and screen voltage adjusting round resistor patterns are formed on volume boards of the focus unit respectively, a supporting shaft is inserted into a central through hole of the round resistor pattern, a connecting pin is inserted into the supporting shaft, a pair of cables are inserted into a volume case so as for the cables to be connected to the lower ends of the connecting pins respectively, a pair of actuation knobs are inserted into a cover, a slider spring is installed within each of volume bars, and the lower end of the slider spring is movably connected to the round resistor pattern.

2. Description of the Prior Art

In the generally known conventional FBT, high and low voltage bobbins which are installed within the FBT case generate a high voltage to supply it through an anode cable to a cathode ray tube of TV or monitor. Here, the focus unit which is installed on a side of the FBT case varies the focus and screen voltages.

FIG. 1 illustrates the conventional focus unit of the FBT. Referring to FIG. 1, a focus volume knob 53 is integrally formed with a rotating piece 54 which extends into a main body 52 of a focus unit 51. Upon the rotating piece 54, there is installed a slider 55 having two contacts. There is installed a board 58 on which a resistor pattern 57 having a variable contact point 57*a* and a central contact point 57*b* is printed. On the board 58, there is installed an output pin 59 for being coupled with the board 58, and the inside of the main body 52 is coated with an insulating resin 60.

In this conventional focus unit 51 constituted as described above, in order to step up or down the focus and screen voltages, if the focus volume knob 53 (extending to the outside of the main body 52) is manually turned, the slider 55 together with the rotating piece 54 is rotated, so that the voltages can be stepped up or down along the resistor patterns 57. Under this condition, the slider 55 has two contact points 56 and 56', and one (56) of the contact points is connected to the variable contact point 57*a* of the circuit pattern 57 to step up or down the focus or screen voltage, while the other (56') of them is connected to the central contact point 57*b* for outputting an output through a resistor.

However, in the conventional focus unit as described above, in order to vary the focus and screen voltages as shown in FIG. 2, the slider 55 having the two contacts 56 and 56' is installed on the end of the adjusting knob 53. In this state, the variable contact point and the central contact point 57*a* and 57*b* are printed on the circuit pattern 57, with the result that the structure is complicated, and defects are caused in the contact points.

Further, as shown in FIG. 1, the height between the two contact points 56 and 56' are very small since they are formed on a flat spring, and therefore, defects occur in drawing the focus and screen voltages due to the limitation of the elasticity. Further, during the adjustment of the volume, the arc is transmitted to the slider, with the aggravation of the electrical characteristics of the slider.

SUMMARY OF THE INVENTION

The present invention is intended to overcome the above described disadvantages of the conventional technique.

Therefore it is an object of the present invention to provide a focus unit of an FBT, in which a slider spring for adjusting the focus volume can be easily installed on a volume bar, the focus and screen voltages can be controlled in a sure manner by reinforcing the elastic force of the slider spring, and the slider spring is installed within an insulating volume bar so as to prevent the aggravation of the electrical characteristics due to the occurrence of arc.

In achieving the above object, the focus unit of an FBT according to the present invention includes: a pair of volume boards with a round focus or screen resistor pattern formed on each of them, and with a through hole being formed at a center of a virtual circle extending along the round resistor pattern; a volume case of the focus unit installed on a side of the FBT so as to receive the volume boards; a pair of supporting shafts extending upward after passing through the through holes of the volume boards respectively; a pair of connecting pins inserted into the supporting shafts respectively; a pair of cables inserted into the case so as to be connected to lower tips of the connecting pins inserted into the supporting shafts respectively; a pair of knob main bodies disposed beneath the actuation knobs respectively, each having a spring passing hole, and with a volume bar being formed on one end of each of actuation knobs; and a pair of slider springs installed within spring receiving holes (through holes) of the knob main bodies respectively, with its one ends being contacted to the connecting pins of the supporting shafts respectively, and with its other ends connected to the resistor patterns of the volume boards respectively.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1A:
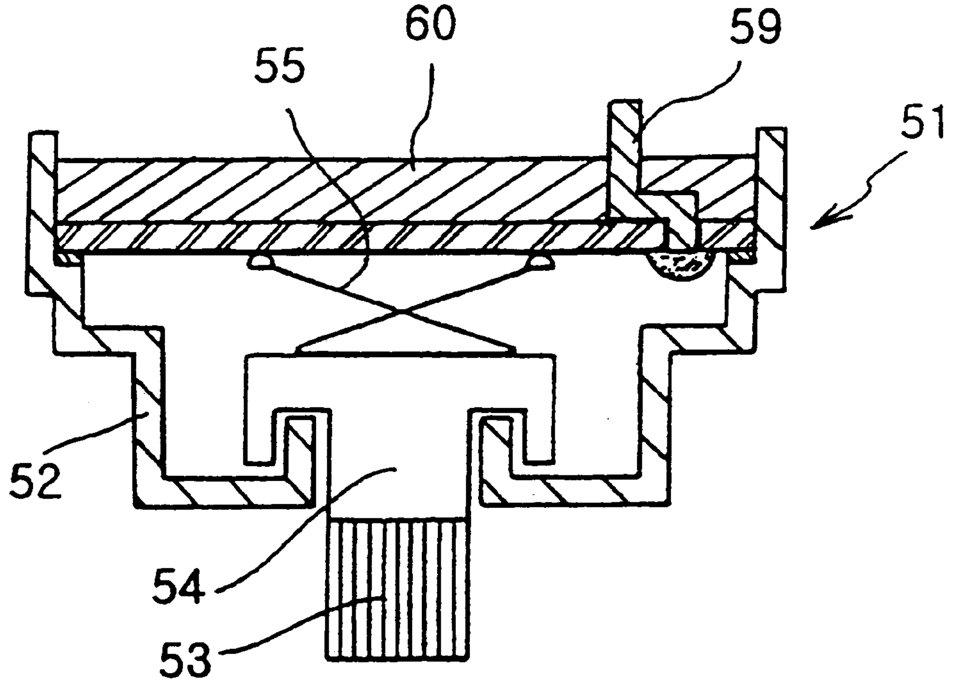
FIG. 1A Prior Art
FIG. 1A is a frontal sectional view showing the internal structure of the general FBT focus unit to show the volume slider.
Figure 1B:
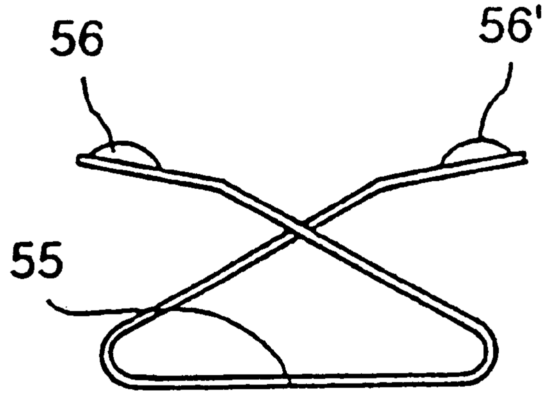
FIG. 1B Prior Art
FIG. 1B is an enlarged view of the volume slider.
Figure 2:
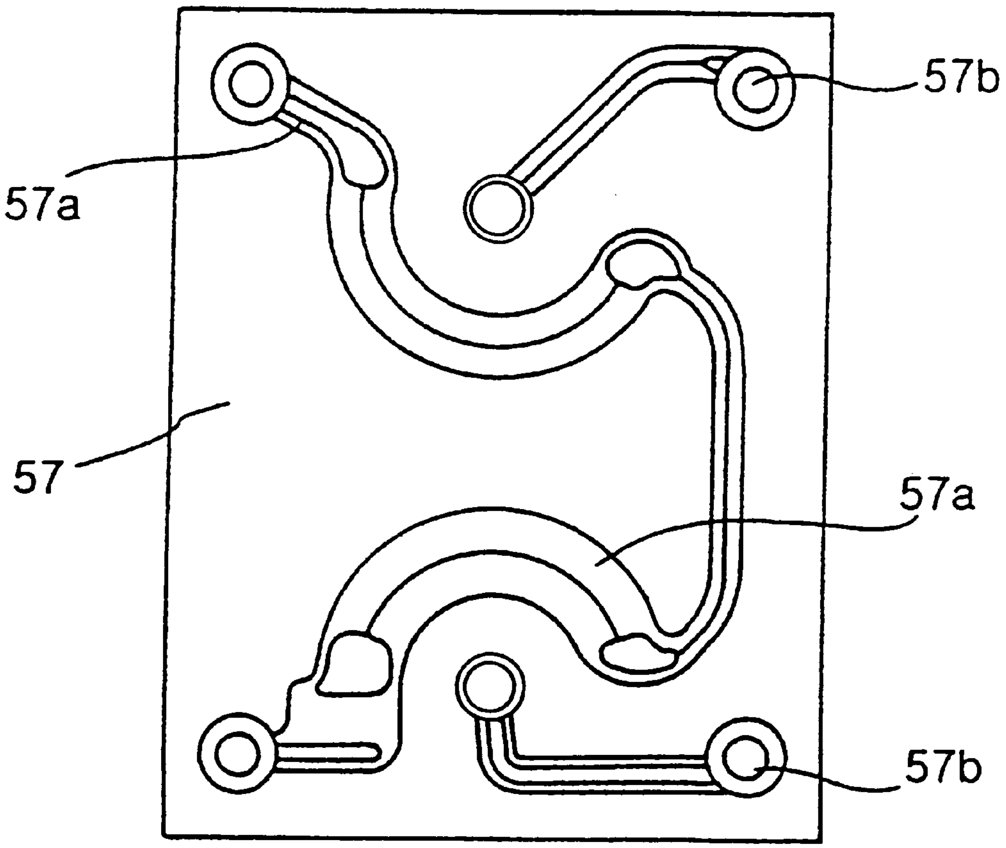
FIG. 2 Prior Art
FIG. 2 illustrates the circuit pattern of the volume board for use in the conventional focus unit.
Figure 3:
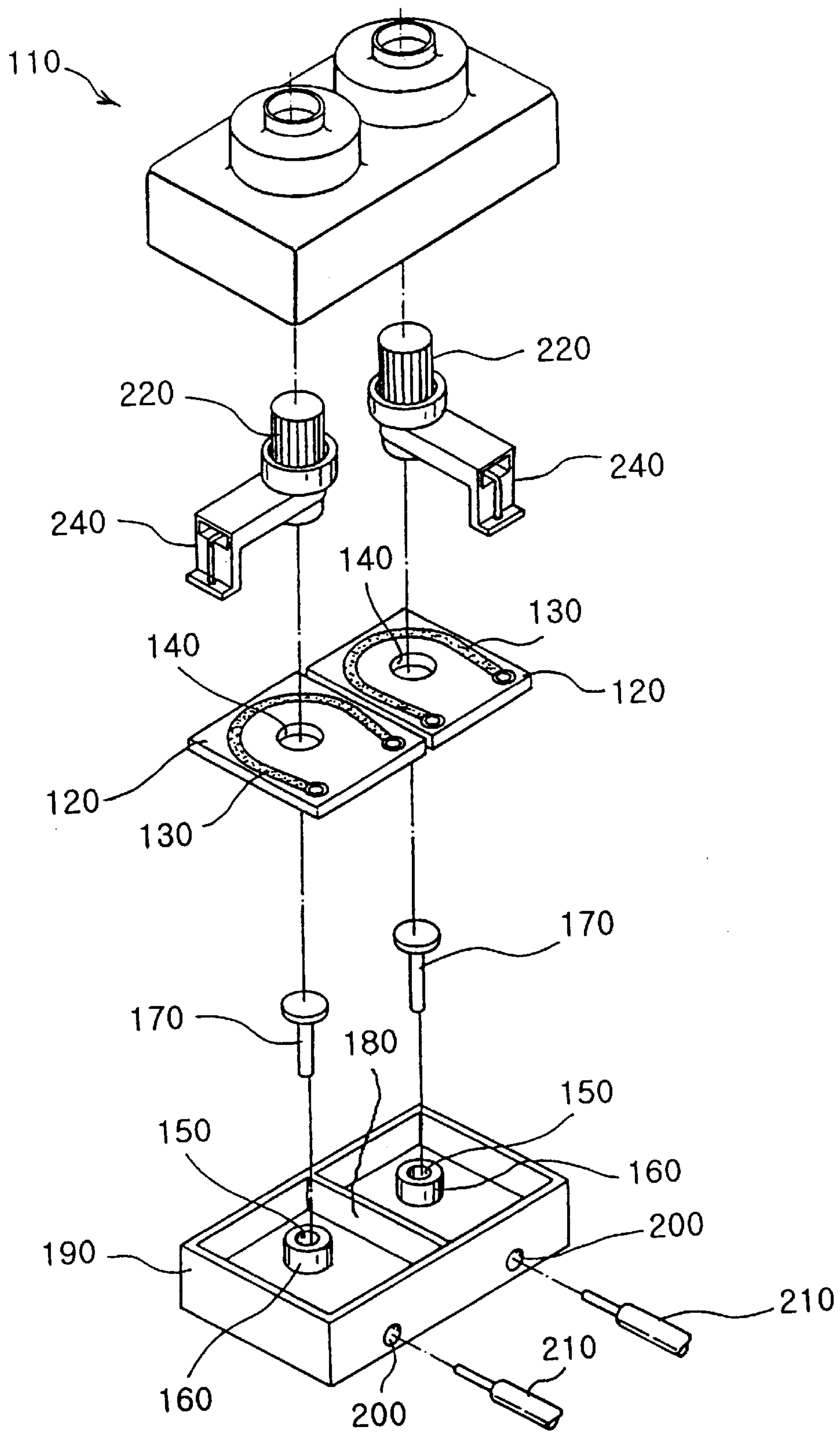
FIG. 3 is an exploded perspective view of the FBT focus unit of the present invention, to show focus volume slider.

FIG. 3 is an exploded perspective view of the FBT focus unit of the present invention, to show focus volume slider.

Figure 4A:
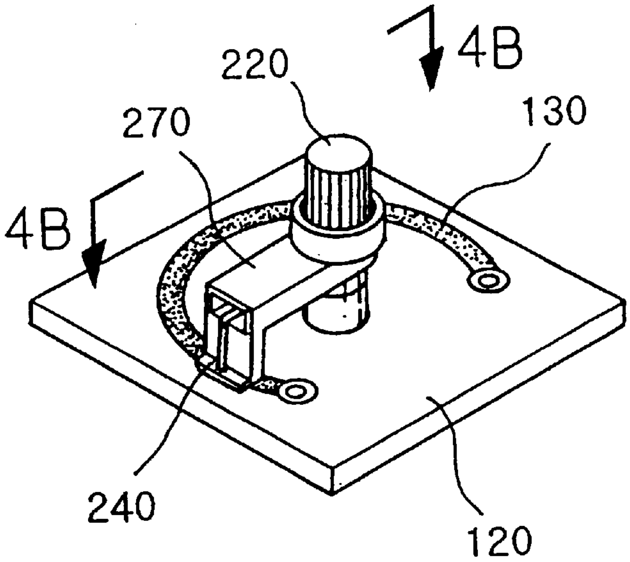
FIG. 4A is a perspective view showing the volume bar installed in the volume board of the present invention.
Figure 4B:
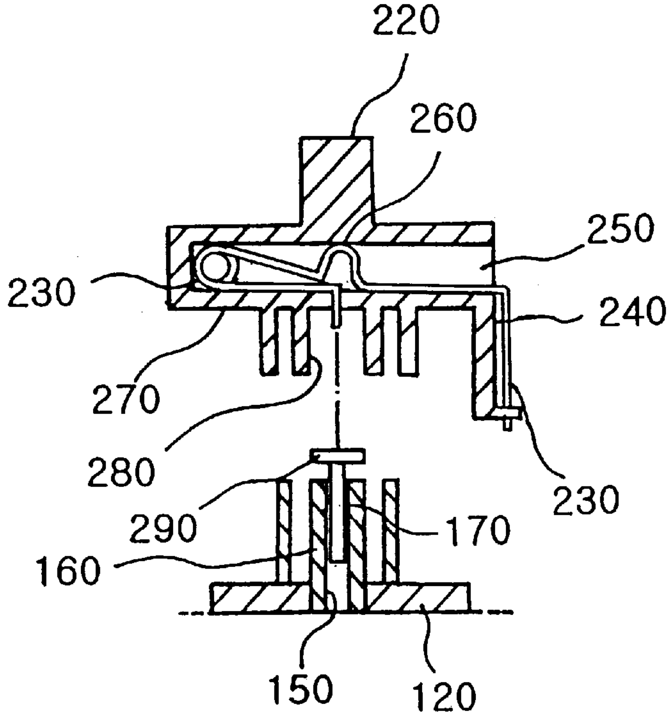
FIG. 4B is a cross-sectional view taken along the line 4B—4B of FIG. 4A.

FIG. 4 illustrates the volume bar installed in the volume board of the present invention. Focus and screen voltage adjusting round resistor patterns 130 are respectively formed on two volume boards 120 which are installed within a focus unit 110. A through hole 140 is formed in each of the volume boards 120 and at a center of a virtual circle extending along the round resistor pattern 130. A supporting shaft 160 having a pin coupling hole 150 passes through the through hole 140 to extend upward. A connecting pin 170 is inserted into the pin coupling hole 150 of the supporting shaft 160.

Further, a case 190 has a partitioning wall 180 to receive the two volume boards 120, and the case 190 has a pair of cable receiving holes 200 into which cables 210 are respectively inserted so as to be connected to the lower tips of the connecting pins 170.

A pair of actuation knobs 220 are installed in the cover of the focus unit 110, and a knob main body 270 has a spring receiving hole 250 for receiving a slider spring 230. A volume bar 240 extends down from the outer tip of the knob main body 270. One end of the slider spring 230 exits the hole 250 and contacts the connecting pin 170, and another end of the slider spring 230 is connected to the round resistor pattern 130 of the volume board 120.

The slider spring 230 has round curved portion 260 so as to retain the slider spring 230 within the spring receiving hole 250, and so as to provide an elastic force to the slider spring 230.

From the center portion of the bottom of the knob main body 270 of the actuation knob 220, there extends a coupling piece 280. The coupling piece 280 is mated with the supporting shaft 160, in a state with the connecting pin 170 accommodated within the supporting shaft 160. The connecting pin 170 has an expanded portion (head) 290 to be elastically contacted with one end of the slider spring 230.

The present invention constituted as above will now be described as to its action and effects.

Figure 5:
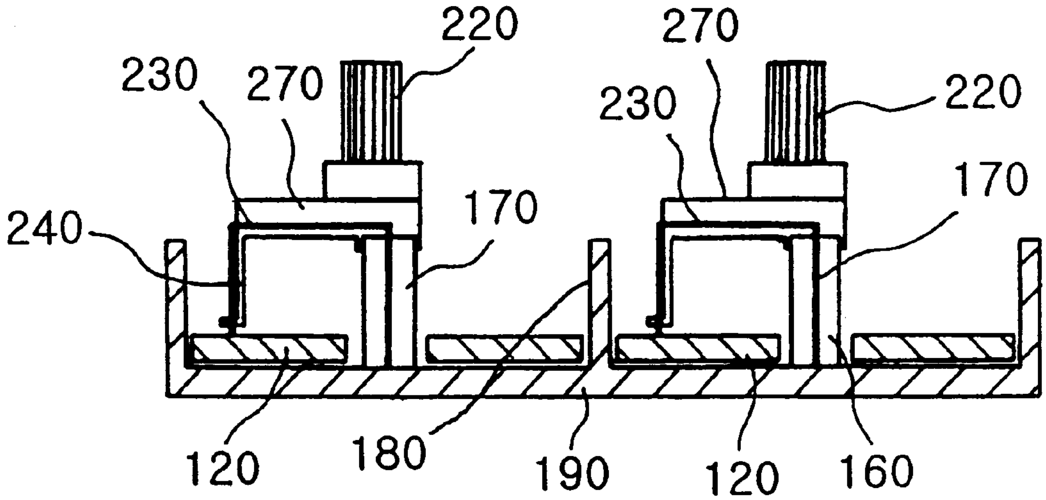
FIG. 5 is a side sectional view showing the operations of the volume bar and the slider installed on the volume board according to the present invention.

As shown in FIGS. 3 to 5, the two volume boards 120 with the focus and screen voltage adjusting round resistor patterns 130 printed thereon are inserted into the volume case 190 of the FBT focus unit 110. In this state, the outer tip of the slider spring 230 is connected to the round resistor pattern 130, so that the focus or screen voltage can be adjusted. Under this condition, the slider spring 230 is made of a wire, and is installed within the knob main body 270 and the volume bar 240. Further, the slider spring 230 revolves together with the volume bar 240 in contact with the round resistor pattern 130, thereby adjusting the voltage.

The volume case 190 of the focus unit 110 has a partitioning wall 180, so that the two separate volume boards 120 can be accommodated within the case 190. A through hole 140 is formed in the volume board 120 and at the center of a virtual circle extending along the round resistor pattern 130. The supporting shaft 160 having the coupling hole 150 is inserted into the through hole 140 of the volume board 120 to protrude above the volume board 120. Then the connecting pin 170 is inserted into the coupling hole-150 of the supporting shaft 160.

The volume case 190 is provided with a pair of cable coupling holes 200 to receive the cables 210, and the cables 210 are connected to the lower tips of the connecting pins 170.

Now the adjustment of the focus and screen voltages by using the slider springs 230 will be described referring to FIGS. 4 and 5. The slider spring 230 is elastically installed within the spring receiving hole 250 of the knob main body 270 of the actuation knob 220. Further, the outer portion of the slider spring 230 extends down together with the volume bar 240, so that the lower end of the slider spring 230 can be elastically contacted to the round resistor pattern 130 of the volume board 120.

Thus the actuation knob 220 is rotated manually, so that the slider spring 230 together with the volume bar 240 can be turned along the round resistor pattern 130 in contact with the pattern, thereby making it possible to draw the focus or screen output voltage. The arcuate curved portion 260 of the slider spring 230 is aligned with the center of the round resistor pattern 130, so that the slider spring 230 can be firmly supported and can exert a secure elastic force.

Meanwhile, the other end of the slider spring 230 is contacted with the connecting pin 170 of the supporting shaft 160 which protrudes above the volume board 120 after passing the board 120. Under this condition, from the center portion of the bottom of the knob main body 270 of the actuation knob 220, there extends down a coupling piece 280. The coupling piece 280 is mated with the supporting shaft 160, in a state with the connecting pin 170 accommodated within the supporting shaft 160. The connecting pin 170 has an expanded portion (head) 290 to be elastically contacted with one end of the slider spring 230.

Therefore, the slider spring 230 is electrically connected through the round resistor pattern 130 and the connecting pin 170 to the cable 210. Thus if the slider spring 230 is turned unitizingly with the volume bar 240, the focus and screen voltages can be adjusted. Here, the knob main body 270 and the volume bar 240 are made of an insulating material, and therefore, any arcing phenomenon which might occur during the adjusting of the focus and screen voltages can be effectively prevented. Therefore, the electrical characteristics can be improved during the adjusting of the focus and screen voltages.

According to the present invention as described above, a slider spring for adjusting the focus volume can be easily installed on a volume bar, and the focus and screen voltages can be controlled in a sure manner by reinforcing the elastic force of the slider spring, while the slider spring is installed within an insulating volume bar so as to prevent the aggravation of the electrical characteristics due to the occurrence of arc.

In the above, the present invention was described based on the specific drawings, but it should be apparent to those ordinarily skilled in the art that various changes and modifications can be added without departing from the spirit and scope of the present invention, which is defined in the appended claims.

What is claimed is:

1. A focus unit for an FBT, comprising:

- a pair of volume boards each having a round resistor pattern formed thereon, and each of said volume boards having a through hole at a center of a virtual circle extending along the respective round resistor pattern;
- a volume case in which said volume boards are received;
- a pair of supporting shafts extending through said through holes of said volume boards, respectively;
- a pair of connecting pins inserted into said supporting shafts, respectively;
- a pair of cables inserted into said case and connected to lower tips of said connecting pins inserted into said supporting shafts, respectively;
- a pair of knob main bodies disposed beneath said actuation knobs, respectively, each knob main body having a spring receiving hole and a volume bar depending from an end of said knob main body; and a pair of slider springs installed within said spring receiving hole of said knob main bodies, respectively, each slider spring having one end exiting said hole and contacting with a respective one of said connecting pins and another end in contact with a respective one of said resistor patterns of said volume boards.

2. The focus unit as claimed in claim 1, wherein said slider spring has an arcuate curved portion to securely retain said slider spring in said spring retaining hole and to reinforce an elasticity of said slider spring, said arcuate curved portion being aligned with an axis of the respective round resistor pattern.

3. The focus unit as claimed in claim 1, wherein from the center portion of the bottom of the knob main body of each actuation knob, there extends a coupling piece, and said coupling piece is mated with a respective one of said supporting shafts.

4. The focus unit as claimed in claim 1, wherein said connecting pin inserted into said supporting shaft has an enlarged head portion.

5. The focus unit as claimed in claim 4, wherein the enlarged head portion of said connecting pin is round and planar.

6. The focus unit as claimed in claim 1, wherein each slider spring is a wire spring for adjusting voltage volumes.

7. The focus unit as claimed in claim 1, wherein said volume boards consist of a volume board with a focus resistor pattern printed thereon to form said resistor pattern thereof, and another volume board with a screen resistor pattern printed thereon to form said resistor pattern thereof.

8. The focus unit as claimed in claim 1, wherein said volume case has a partitioning wall interposed between said volume boards for isolating one volume board from the other.

9. A focus unit for an FBT, comprising:

a pair of volume boards each having a round resistor pattern formed thereon, and each of said volume boards having a through hole at a center of a virtual circle extending along the respective round resistor pattern;

a volume case in which said volume boards are received;

a pair of supporting shafts extending through said through holes of said volume boards, respectively;

a pair of connecting pins inserted into said supporting shafts, respectively;

a pair of cables inserted into said case and connected to lower tips of said connecting pins inserted into said supporting shafts, respectively;

a pair of knob main bodies disposed beneath said actuation knobs, respectively, each knob main body having a spring receiving hole and a volume bar depending from an end of said knob main body; and a pair of slider springs installed within said spring receiving hole of said knob main bodies, respectively, each slider spring having one first end in contact with a respective one of said connecting pins and another end in contact with a respective one of said resistor patterns of said volume boards;

wherein said connecting pin inserted into said supporting shaft has an enlarged head portion; and wherein said enlarged head portion is elastically contacted with said one first end of said slider spring.

* * * * *